(12) United States Patent
Pi

(10) Patent No.: US 11,942,131 B2
(45) Date of Patent: Mar. 26, 2024

(54) PROCESSING APPARATUSES INCLUDING MAGNETIC RESISTORS

(71) Applicant: Samsung Electronics Co., Ltd., Suwon-si (KR)

(72) Inventor: Unghwan Pi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 157 days.

(21) Appl. No.: 17/834,074

(22) Filed: Jun. 7, 2022

(65) Prior Publication Data
US 2023/0024858 A1    Jan. 26, 2023

(30) Foreign Application Priority Data
Jul. 16, 2021 (KR) .................... 10-2021-0093686

(51) Int. Cl.
*G11C 11/16* (2006.01)
*G11C 11/54* (2006.01)

(52) U.S. Cl.
CPC ...... *G11C 11/1673* (2013.01); *G11C 11/1655* (2013.01); *G11C 11/1675* (2013.01); *G11C 11/1697* (2013.01); *G11C 11/54* (2013.01)

(58) Field of Classification Search
CPC ............ G11C 11/1673; G11C 11/1655; G11C 11/1675; G11C 11/1697; G11C 11/54; G11C 11/161; G06N 3/08; G06N 3/065; G06G 7/14; G06G 7/16
See application file for complete search history.

(56) References Cited

U.S. PATENT DOCUMENTS

| | | | |
|---|---|---|---|
| 8,476,925 B2 | 7/2013 | Zhu et al. | |
| 10,417,136 B2 | 9/2019 | Horner et al. | |
| 10,474,948 B2 | 11/2019 | Yakopcic et al. | |
| 10,559,353 B2 | 2/2020 | Boniardi et al. | |
| 10,892,009 B2 | 1/2021 | Sasaki | |
| 2010/0008135 A1* | 1/2010 | Cho | G11C 11/1675 |
| | | | 365/171 |
| 2017/0287978 A1 | 10/2017 | Toh et al. | |
| 2020/0126631 A1* | 4/2020 | Sasaki | G11C 11/161 |
| 2020/0233922 A1 | 7/2020 | Ielmini et al. | |
| 2020/0349217 A1 | 11/2020 | Luo | |
| 2021/0383853 A1* | 12/2021 | Shibata | H10B 61/22 |
| 2022/0188618 A1* | 6/2022 | Yamada | H10B 99/00 |
| 2022/0261559 A1* | 8/2022 | Shibata | H10N 70/00 |

OTHER PUBLICATIONS

Tiwari, Vipin "How analog in-memory computing can solve power challenges of edge AI inference" Embedded (13 pages) (Feb. 4, 2020).

\* cited by examiner

*Primary Examiner* — Jerome Leboeuf
(74) *Attorney, Agent, or Firm* — Myers Bigel, P.A.

(57) ABSTRACT

A processing apparatus includes a bit-cell array including at least one bit-cell line including a plurality of bit-cells electrically connected to each other in series, wherein each of the plurality of bit-cells includes: a first magnetic resistor that is configured to store a first resistance value based on a movement of a location of a magnetic domain-wall; a second magnetic resistor that is configured to store a second resistance value, wherein the second resistance value is equal to or less than the first resistance value; a first switching element configured to switch an electrical signal applied to the first magnetic resistor; and a second switching element configured to switch an electrical signal applied to the second magnetic resistor.

20 Claims, 12 Drawing Sheets

PROCESSING APPARATUSES INCLUDING MAGNETIC RESISTORS

CROSS-REFERENCE TO RELATED APPLICATION

This application is based on and claims priority under 35 U.S.C. § 119 to Korean Patent Application No. 10-2021-0093686, filed on Jul. 16, 2021 in the Korean Intellectual Property Office, the disclosure of which is incorporated by reference herein in its entirety.

BACKGROUND

The present disclosure relates to processing apparatuses. To overcome structural limits of chips based on an existing von Neumann structure, neural network hardware or a neuromorphic processor (NP) based on a neural network including neurons, which are base units constituting a human brain, synapses providing interconnection between the neurons, or the like, is under development. The neural network exceeds limits of existing machine learning algorithms, exhibits image, video, pattern learning, and recognition capability at a level close to a human capability, and has been used in various fields. A computation operation of the neural network may be performed by using a resistor.

In general, a magnetic tunnel junction (MTJ) element is used as a resistor, but an existing MTJ element may store a weighting factor only in a binary form. In other words, the MTJ element may store only one of two resistance values, and accordingly, may have a difficulty in storing various resistance values. In addition, because a speed of a write operation of an existing MTJ element is slow, the MTJ element may have a difficulty in quickly updating the weighting factor.

SUMMARY

The inventive concept provides a processing apparatus, which stores various resistance values in a resistor, is capable of a multiplication computation and an addition computation even without complex logic gates, and performs a computation of a neuromorphic processor fast and at a low power.

According to an aspect of the inventive concept, there is provided a processing apparatus including a bit-cell array including at least one bit-cell line including a plurality of bit-cells electrically connected to each other in series, wherein each of the plurality of bit-cells includes: a first magnetic resistor that is configured to store a first resistance value based on a movement of a location of a magnetic domain-wall; a second magnetic resistor that is configured to store a second resistance value, wherein the second resistance value is equal to or less than the first resistance value; a first switching element configured to switch an electrical signal applied to the first magnetic resistor; and a second switching element configured to switch an electrical signal applied to the second magnetic resistor.

According to another aspect of the inventive concept, there is provided a processing apparatus including a bit-cell array including at least one bit-cell line including a plurality of bit-cells electrically connected to each other in series, wherein each of the plurality of bit-cells includes: a first magnetic resistor that is configured to store a first resistance value based on a movement of a location of a magnetic domain-wall; a second magnetic resistor electrically connected to the first magnetic resistor in parallel, and configured to store a second resistance value that is equal to or less than the first resistance value; a first switching element electrically connected to the first magnetic resistor in series, and configured to switch an electrical signal applied to the first magnetic resistor; a second switching element electrically connected to the second magnetic resistor in series, and configured to switch an electrical signal applied to the second magnetic resistor; and a third switching element connecting layers of the first magnetic resistor to each other, the layers having an identical magnetization direction to each other.

According to another aspect of the inventive concept, there is provided a processing apparatus including a bit-cell array including at least one bit-cell line including a plurality of bit-cells electrically connected to each other in series, wherein each of the plurality of bit-cells includes: a first magnetic resistor including a pinned layer having a magnetization direction thereof pinned, a free layer including a magnetic domain-wall and a first region having an identical magnetization direction to the pinned layer and a second region having a different magnetization direction from the pinned layer, and a tunnel layer between the pinned layer and the free layer, and the first magnetic resistor is configured to store a first resistance value based on a movement of a location of the magnetic domain-wall; a second magnetic resistor that is configured to store a second resistance value, wherein the second resistance value that is equal to or less than the first resistance value; a first switching element configured to switch an electrical signal applied to the first magnetic resistor; and a second switching element configured to switch an electrical signal applied to the second magnetic resistor, wherein the bit-cell array includes: a fourth switching element electrically connected to the first magnetic resistor and the second magnetic resistor; and a fifth switching element electrically connected to the first switching element and the second switching element, and electrically connected to a different data line from a data line, to which the fourth switching element is electrically connected.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept will be described in detail with reference to the accompanying drawings.

Figure 1:
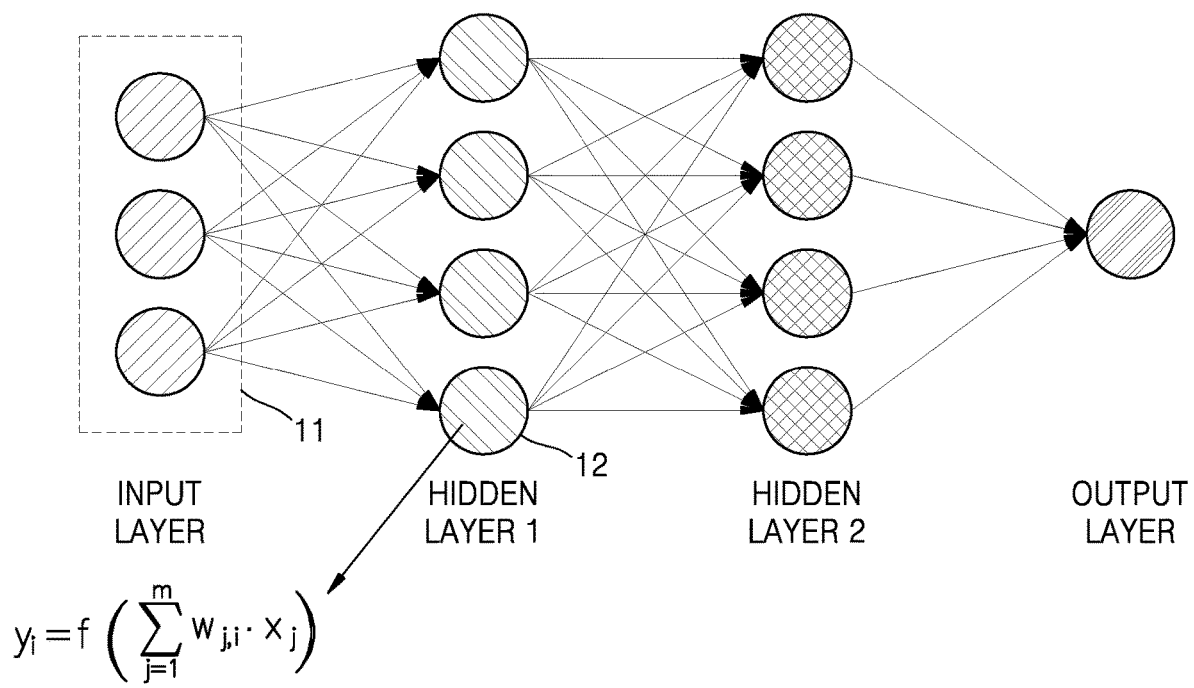
FIG. 1 is a conceptual diagram of an example of a neural network.

FIG. 1 is a conceptual diagram of an example of a neural network 10.

A human brain may learn and memorize a large amount of information by transmitting and processing various signals via a neural network formed by a large number of neurons interconnected to each other. Various attempts to develop a processing apparatus or a computing apparatus for efficiently processing a large amount of information by imitating a biological neural network have continued.

Referring to FIG. 1, the neural network 10 may include an artificial neural network (ANN) imitating the biological neural network described above. For example, the neural network 10 may include a deep neural network (DNN), or a convolution neural network (CNN), but is not necessarily limited thereto.

FIG. 1 illustrates, for convenience of description, that the neural network 10 includes two hidden layers, but the neural network 10 may not be limited thereto, and may include various numbers of hidden layers. In addition, in FIG. 1, the neural network 10 is illustrated to include an input layer 11, which is separate from the hidden layer, for receiving input data, but according to an embodiment, the input data may also be input directly to the hidden layer rather than being input through the input layer 11.

Nodes of layers other than an output layer in the neural network 10 may be connected to nodes of a next layer via links for transmitting an output signal. Values, which are obtained by multiplying node values of the nodes included in a previous layer by a weight allocated to each link, may be input to one node via the links. The node values of the previous layer may correspond to axon values of the biological neural network, and the weight may correspond to a synaptic weight of the biological neural network. The weight may be referred to as a parameter of the neural network 10. An activation function may include a Sigmoid function, a hyperbolic tangent (tanh) function, a rectified linear unit (ReLU) function, or the like, and a non-linearity of the neural network 10 may be implemented by the activation function.

An output of an arbitrary node 12 included in the neural network 10 may be represented by Formula 1 below.

$$y_i = f\left(\sum_{j=1}^{m} w_{j,i} x_j\right)$$ [Formula 1]

Formula 1 may represent an output value $y_i$ of an $i^{th}$ node 12 for m input values of an arbitrary layer. $x_j$ may represent an output value of a $i^{th}$ node of the previous layer, and $w_{j,i}$ may represent a weight applied to an interconnection between the $j^{th}$ node of the previous layer and an $i^{th}$ node 12 of a current layer. f( ) may represent an activation function. As illustrated in Formula 1, in an activation function, accumulation of results of multiplying the input value $x_j$ by the weight $w_{j,i}$ may be used. In other words, at each node, a multiplying and accumulating operation of multiplying the input value $x_j$ by the weight $w_{j,i}$ and accumulating results thereof, that is, a multiply accumulate (MAC) operation, may be performed. In addition to this application, there may be various application areas using/requiring the MAC operation, and to this end, a processing apparatus capable of processing the MAC operation in an analog circuit region may be used.

Figure 2:
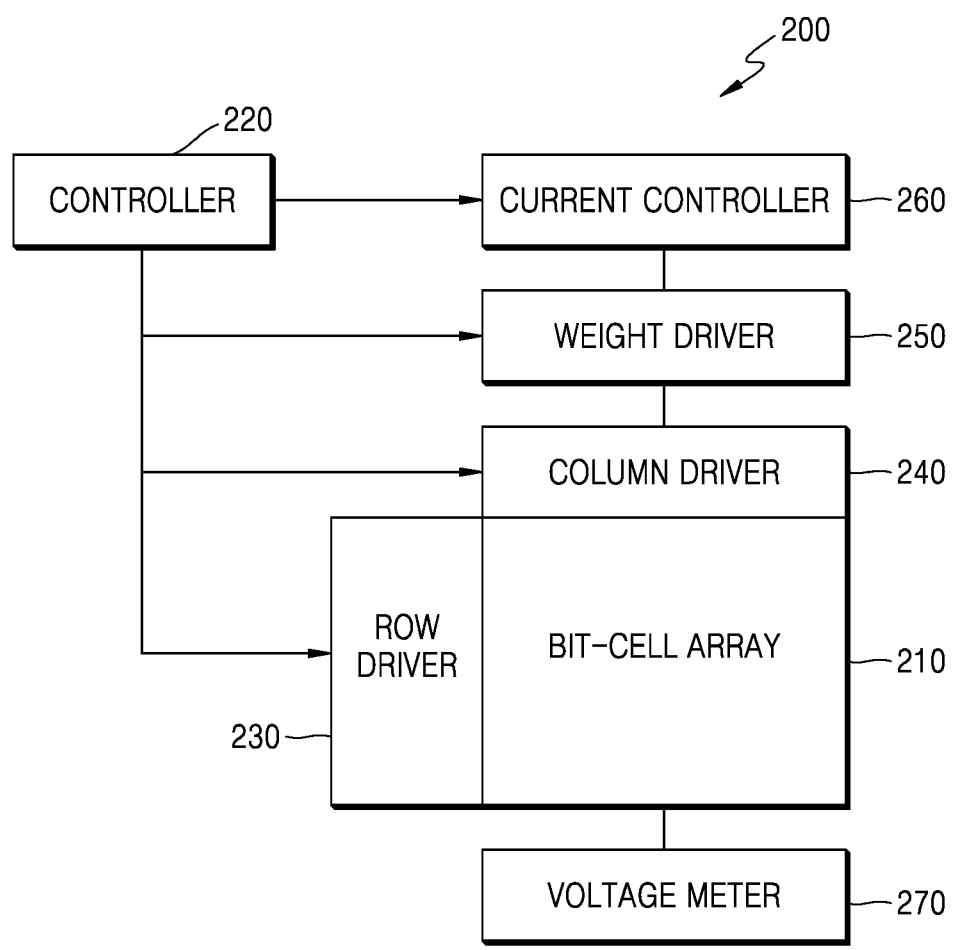
FIG. 2 is a block diagram of a processing apparatus according to an example embodiment.

FIG. 2 is a block diagram of a processing apparatus 200 according to an example embodiment.

Referring to FIG. 2, the processing apparatus 200 may include a bit-cell array 210, a controller 220, a row driver 230, a column driver 240, a weight driver 250, a current controller 260, and a voltage meter 270. According to an embodiment, the processing apparatus 200 may further include other general purpose components in addition to components illustrated in FIG. 2.

The bit-cell array 210 may include a plurality of bit-cells. The plurality of bit-cells may be electrically connected to each other in series to constitute a bit-cell line, and the bit-cell array 210 may include at least one bit-cell line.

The bit-cell may, based on a movement of a location of a magnetic domain-wall, include a first magnetic resistor in which a first resistance value is stored, a second magnetic resistor in which a second resistance value equal to or less than the first resistance value is stored, a first switching element switching an electrical signal applied to the first magnetic resistor, and a second switching element switching an electrical signal applied to the second magnetic resistor. Accordingly, the magnetic resistors are configured to store resistance values, and the switching elements are configured to switch electrical signals applied to the magnetic resistors.

The magnetic domain-wall may move based on a bias voltage applied to a first region in a first magnetization direction and a bias voltage applied to a second region in a direction different from the first magnetization direction. Based on the location of the magnetic domain-wall, the first resistance value may be stored in the first magnetic resistor. In the first magnetic resistor, the first resistance value may vary according to the location of the magnetic domain-wall, and various resistance values may be stored as the first resistance value in the first magnetic resistor.

The controller 220 may decode commands used/required for driving and operating the processing apparatus 200. For example, the controller 220 may decode commands for weight setting, weight setting inspection, input signal application, voltage measurement, or the like, and may transfer signals to components used/required for performing these commands. The controller 220 may control the processing apparatus 200 so that the processing apparatus 200 performs a write operation and a read operation. For example, the controller 220 may control the row driver 230 and the column driver 240 for selecting a bit-cell, on which the write operation is to be performed.

The row driver 230 may receive a row address and an input signal, and apply the input signal to the bit-cell array 210. The row driver 230 may include a digital-to-analog converter (DAC) or an analog-to-digital converter (ADC), apply a first input signal to the first switching element, and apply a second input signal to the second switching element. For example, when the first input signal of a logic high level is applied, the first switching element may be in an on status, and when the second input signal of a logic low level is applied, the second switching element may be in an off status. When the first input signal is about 1, the first switching element may be in an on status, and when the second input signal is about 0, the second switching element may be in an off status.

In addition, the row driver 230 may change the first resistance value of the first magnetic resistor included in the bit-cell inside the bit-cell array 210. A resistance value of the first magnetic resistor may be changed by applying the write operation. The row driver 230 may, for selecting a bit-cell, on which the write operation is to be performed, provide driving signals to a fourth switching element connected to the first magnetic resistor and the second magnetic resistor of the bit-cell, on which the write operation is to be performed, and a fifth switching element connected to the first switching element and the second switching element of the bit-cell. When the fourth switching element and the fifth switching element connected to the bit-cell, on which the write operation is to be performed, are in an on status based on the driving signal, the first resistance value of the first magnetic resistor may be written to the bit-cell.

The column driver 240 may receive a column address and a weight setting signal, and apply a voltage/current to a magnetic resistor. A weighting factor may mean the first resistance value, or may also mean a value corresponding to the first resistance value. The column driver 240 may receive the weight setting signal for setting the weighting factor, and apply a voltage/current to a data line connected to the fourth switching element and a data line connected to the fifth switching element. The magnetic domain-wall may move based on a voltage applied to a data line connected to the fourth switching element and a voltage applied to a data line connected to the fifth switching element, and the first resistance value may be stored in the first magnetic resistor. The column driver 240 may select the bit-cell line in need of the voltage measurement and the weight line connected to the bit-cell using/requiring the weight setting.

The weight driver 250 may transfer weighting factor data to the bit-cell, which is selected by the row driver 230 and the column driver 240 at the time of setting the weight. The weight driver 250 may drive the bit-cell line connected to the column driver 240, and set the weighting factor.

The current controller 260 may receive a signal of the controller 220, drive a current source, and apply a current to the bit-cell line.

The voltage meter 270 may measure a voltage of the bit-cell line, and store the measured value in an external memory (not illustrated). By measuring a voltage of the bit-cell line, a multiply computation and an accumulate computation may be performed. When a processing apparatus performs the read operation, the multiply computation and the accumulate computation may be performed by measuring a voltage of the bit-cell line. The voltage meter 270 may include an ADC, which outputs the measurement value as a digital value.

Figure 3:
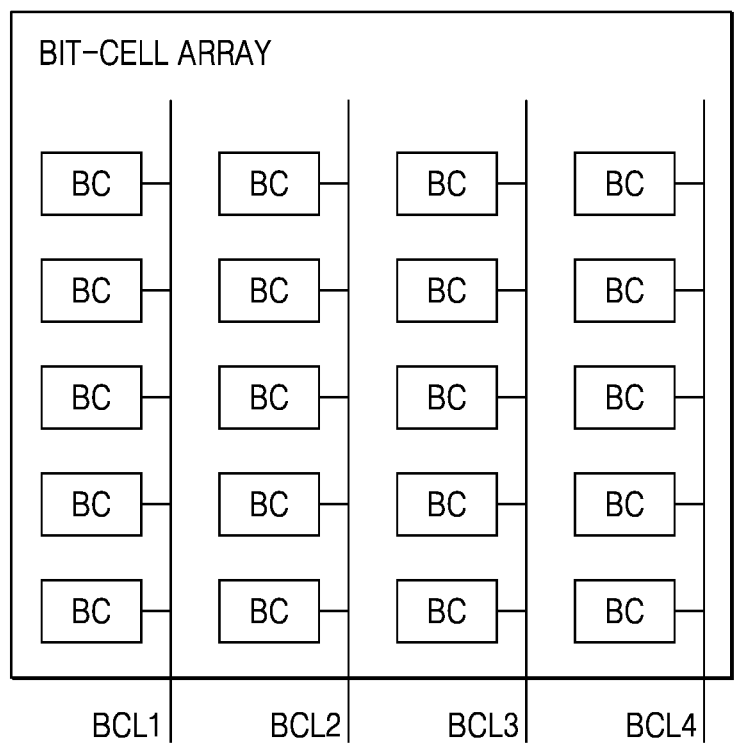
FIG. 3 is a diagram of a bit-cell array according to an example embodiment.

FIG. 3 is a diagram of a bit-cell array according to an example embodiment.

Referring to FIG. 3, the bit-cell array may include bit-cell lines BCL1, BCL2, BCL3, and BCL4. The bit-cell lines BCL1, BCL2, BCL3, and BCL4 may be arranged such that a plurality of bit-cells BC are electrically connected to each other in series in a column direction in each of the bit-cell lines BCL1, BCL2, BCL3, and BCL4. In FIG. 3, the bit-cell array is illustrated to include four bit-cell lines BCL1, BCL2, BCL3, and BCL4, but the number of bit-cell lines included in the bit-cell array is not necessarily limited thereto. Hereinafter, duplicate detailed descriptions of those already given above may be omitted.

The bit-cell array may be driven in column units. A processing apparatus (for example, the processing apparatus 200 in FIG. 2) may accumulate multiply operation values of bit-cells of the same bit-cell line. For example, the processing apparatus may accumulate multiply operation values of bit-cells BC, in which a multiply operation has been performed, of the bit-cells BC of a bit-cell line BCL1. By measuring a voltage of the bit-cell line BCL1, the multiply computation and the accumulate computation may be performed. As another example, when the processing apparatus performs the read operation, the processing apparatus may accumulate the multiply operation values of bit-cells BC, in which the multiply operation has been performed, of the bit-cells BC of a bit-cell line BCL3.

Figure 4:
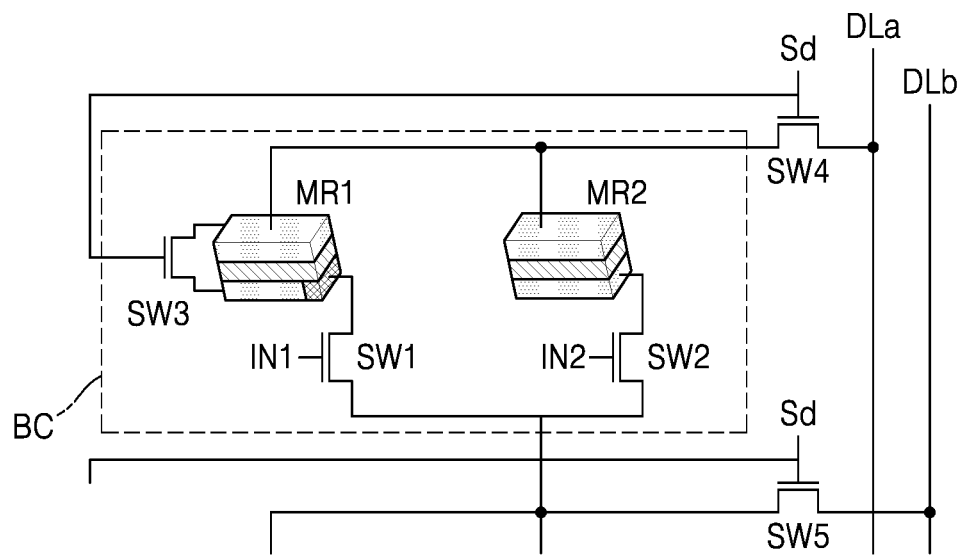
FIG. 4 is a circuit diagram of a structure of a bit-cell, according to an example embodiment.

FIG. 4 is a circuit diagram of a structure of the bit-cell BC, according to an example embodiment.

Referring to FIG. 4, the bit-cell BC may include a first magnetic resistor MR1, a second magnetic resistor MR2, a first switching element SW1, a second switching element SW2, and a third switching element SW3. The processing apparatus 200 may include an apparatus to implement a neuromorphic processor, a neural processor, or the like, and may include a plurality of bit-cells arranged in a two-dimensional array structure. The processing apparatus 200 may include an in-memory processing apparatus, which, for example, stores data in a memory, that is, a magnetic resistor, and when an operation is desired/necessary, uses the stored data. Hereinafter, duplicate detailed descriptions of those already given above may be omitted.

The first magnetic resistor MR1 may include a magnetic domain-wall (e.g., a magnetic domain-wall 533 (FIGS. 5A-5C)). The first resistance value may be stored in the first magnetic resistor MR1 based on movement of a location of the magnetic domain-wall. The first resistance value may be stored in the first magnetic resistor MR1 based on the weight setting signal. The first resistance value may mean a value corresponding to the weighting factor, or comprising the weighting factor.

The second resistance value that is equal to or less than the first resistance value stored in the first magnetic resistor MR1 may be stored in the second magnetic resistor MR2. The second magnetic resistor MR2 may be electrically connected to the first magnetic resistor MR1 in parallel. The second magnetic resistor MR2 may include the same magnetic resistor element as the first magnetic resistor MR1. The first resistance value corresponding to the weighting factor may be stored in the first magnetic resistor MR1, and the minimum resistance value (R min) of the magnetic resistor may be stored in the second magnetic resistor MR2. In other words, the second magnetic resistor MR2 may be maintained at a constant value corresponding to the R min. Hereinafter, a structure and an operation of a magnetic resistor are described in detail with reference to FIGS. 5A through 5C.

Figure 5A:
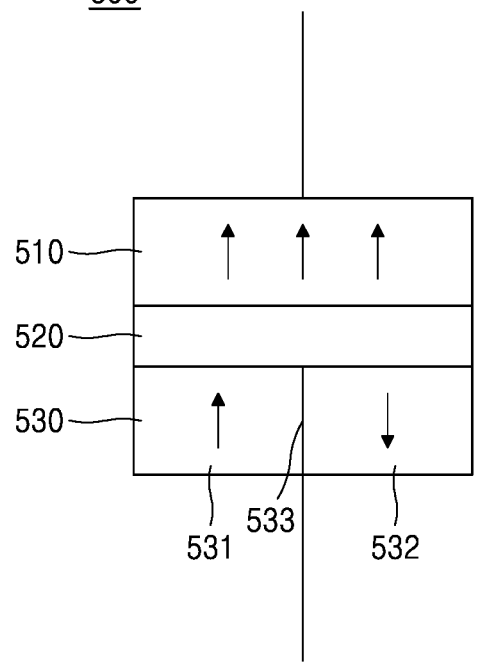
FIGS. 5A through 5C are diagrams of structures of a magnetic resistor, according to example embodiments.
Figure 5B:
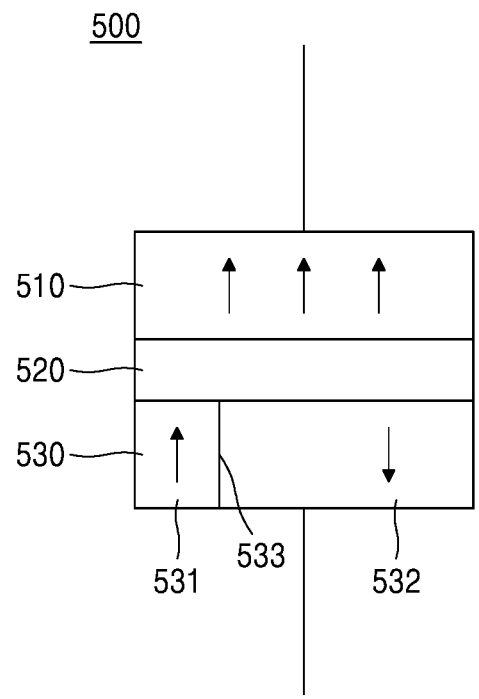
Figure 5C:
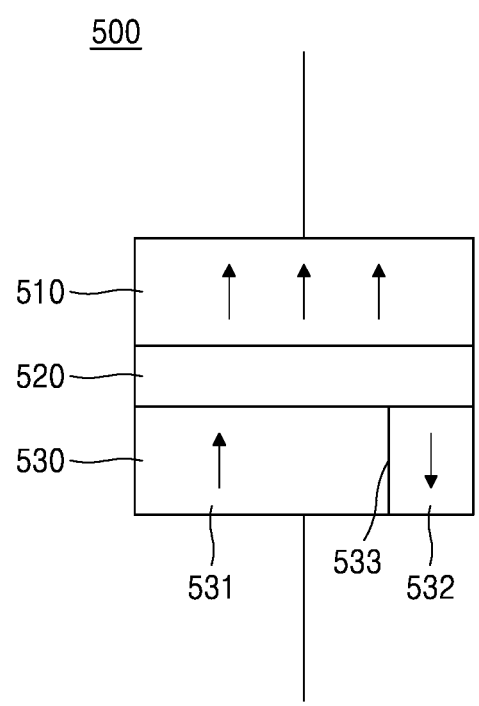

FIGS. 5A through 5C are diagrams of structures of a magnetic resistor 500, according to example embodiments.

Referring to FIG. 5A, the magnetic resistor 500 may include a pinned layer 510, a tunnel layer 520, and a free layer 530. The magnetic resistor 500 may have a non-volatile characteristic, in which a resistance value thereof is changed depending on a magnitude and a direction of a current (or voltage), and the resistance value thereof is maintained as is, even when the input current (or voltage) is blocked.

A magnetization direction of the pinned layer 510 may be pinned, and a magnetization direction of the free layer 530 may be equal to or different from the magnetization direction of the pinned layer 510 according to conditions. The free layer 530 may include a magnetic domain-wall 533. The free layer 530 may include a first region 531 having the same magnetization direction as the pinned layer 510, and may include a second region 532 having a different magnetization direction from the pinned layer 510. The magnetic domain-wall 533 may be between (i.e., may separate) the first region 531 and the second region 532.

The magnetic resistor 500 may store a variable resistance value based on respective lengths of the first region 531 and the second region 532. The lengths of the first region 531 and the second region 532 may vary depending on the movement location of the magnetic domain-wall 533, and the resistance value may be stored based on the lengths of the first region 531 and the second region 532. The lengths of the first region 531 and the second region 532 may be lengths in a direction perpendicular to the magnetic domain-wall 533, and thus perpendicular to the magnetization direction of the pinned layer 510.

The location of the magnetic domain-wall 533 may be moved based on a first bias voltage applied to the first region 531 and a second bias voltage applied to the second region 532, and the resistance value may be stored in the magnetic resistor 500. For example, the resistance value may be stored in the magnetic resistor 500 according to the location of the magnetic domain-wall 533, which has been moved based on a difference between the first bias voltage and the second bias voltage (which voltages may both be applied via, for example, the pinned layer 510). As an example, when the first bias voltage is greater than the second bias voltage, the magnetic domain-wall 533 may be moved in a direction of the second region 532 so that the length of the second region 532 is shortened. When the second bias voltage is greater than the first bias voltage, the magnetic domain-wall 533 may be moved toward the first region 531 so that the length of the second region 532 is lengthened. However, the embodiment is not necessarily limited thereto.

The resistance value stored in the magnetic resistor 500 (e.g., the first resistance value stored in the first magnetic resistor MR1) may be directly proportional to the length of the second region 532, or may be inversely proportional to the length of the first region 531. For example, when the length of the second region 532 is increased, the resistance value stored in the magnetic resistor 500 may be increased. The processing apparatus 200 may change the resistance value stored in the magnetic resistor 500 by moving the location of the magnetic domain-wall 533. Resistance in the second region 532 having a different magnetization direction from the pinned layer 510 may be large, and resistance in the first region 531 having a different magnetization direction from the pinned layer 510 may be small.

In FIG. 5A, the lengths of the first region 531 and the second region 532 of the magnetic resistor 500 may be identical to each other, in FIG. 5B, the length of the second region 532 of the magnetic resistor 500 may be greater than that of the first region 531, and in FIG. 5C, the length of the second region 532 of the magnetic resistor 500 may be less than that of the first region 531. The resistance value of the magnetic resistor 500 of FIG. 5B may be greater than that of the magnetic resistor 500 of FIG. 5A, and the resistance value of the magnetic resistor 500 of FIG. 5A may be greater than that of the magnetic resistor 500 of FIG. 5C. For example, the resistance value of the magnetic resistor 500 of FIG. 5B may be greater than that of the magnetic resistor 500 of FIG. 5A by about 10 ohms ($\Omega$), and the resistance value of the magnetic resistor 500 of FIG. 5A may be greater than that of the magnetic resistor 500 of FIG. 5C by about 10$\Omega$.

When the resistance value is stored in the magnetic resistor 500 based on the movement of the location of the magnetic domain-wall 533, various resistance values according to the location of the magnetic domain-wall 533 may be stored as the weighting factors based on the first bias voltage and the second bias voltage. The resistance value according to various weighting factors may be stored in the magnetic resistor 500. Various weighting factors may be represented without logic gates, and an operation speed of a processing apparatus may be improved.

The pinned layer 510 may have a pinned magnetization direction by an anti-ferromagnetic layer. The pinned layer 510 may include a ferromagnetic material such as CoFeB, FeB, Fe, Co, Ni, CoPt, CoNi, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$, and/or a combination thereof, and may further include an anti-ferromagnetic layer and/or a synthetic anti-ferromagnetic layer for pinning the magnetization direction. The anti-ferromagnetic layer may include an anti-ferromagnetic material such as PtMn, IrMn, MnO, MnS, MnTe, $MnF_2$, $FeC_{12}$, FeO, $CoC_{12}$, CoO, $NiC_{12}$, NiO, and Cr, and/or a combination thereof. The synthetic anti-ferromagnetic layer may include Cu, Ru, Ir, and/or a combination thereof.

The tunnel layer 520 may have a thickness less than a spin diffusion distance, and may include a non-magnetic material such as Mg, Ti, Al, an oxide of MgZn and MgB, and V, or a combination thereof, and an oxide thereof. The tunnel layer 520 may be between the pinned layer 510 and the free layer 530.

The free layer 530 may include a material having a changeable magnetization direction, for example, a ferromagnetic material. The free layer 530 may include, for example, CoFeB, FeB, Fe, Co, Ni, Gd, Dy, CoFe, NiFe, CoFeNb, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$, and/or a combination thereof. In addition, the free layer 530 may include a synthetic anti-ferromagnetic material. For example, the free layer 530 may include CoFeB/Ru/CoFeB, CoFeB/MgO/CoFeB, CoFeB/Ir/CoFeB, CoNi/Ru/CoNi, CoNi/Ir/CoNi, etc.

Referring to FIG. 4 again, the first switching element SW1 may switch an electrical signal applied to the first magnetic resistor MR1, and the second switching element SW2 may switch an electrical signal applied to the second magnetic resistor MR2. The first switching element SW1 may be electrically connected to the first magnetic resistor MR1 in series, and the second switching element SW2 may be electrically connected to the second magnetic resistor MR2 in series.

A first input signal IN1 may be input to the first switching element SW1, and a second input signal IN2 may be input to the second switching element SW2. The first switching element SW1 and the second switching element SW2 may perform an on/off operation according to the input signal.

The first input signal IN1 and the second input signal IN2 may be complementary to each other. The first switching element SW1 and the second switching element SW2 may operate complementarily so that when any one is closed, the other is open. Each of the first switching element SW1 and the second switching element SW2 may switch an electrical signal according to an input signal input thereto. For example, when the first input signal IN1 is about 1, and the second magnetic resistor MR1 is about 0, the electrical signal applied to the first magnetic resistor MR1 may be applied to another bit-cell via the first switching element SW1.

The third switching element SW3 may be electrically connected to a pinned layer and a free layer of the first magnetic resistor MR1. The third switching element SW3 may connect layers of the first magnetic resistor MR1 to each other, which have the same magnetization direction as each other. In other words, the third switching element SW3 may be electrically connected to the first region 531 of the free layer and the pinned layer of the first magnetic resistor MR1.

When a processing apparatus performs the write operation, the third switching element SW3 may be in an on status, and the pinned layer may be electrically connected to the first region 531 of the first magnetic resistor MR1. The first bias voltage applied to the pinned layer may be applied to the first region 531 via the third switching element SW3. For example, the first bias voltage corresponding to a first data line DLa may be provided to the first region 531 via the third switching element SW3. Based on the first bias voltage and the second bias voltage, a magnetic domain-wall of the free layer of the first magnetic resistor MR1, and the write operation may be performed in the first magnetic resistor MR1. The first bias voltage may mean a bias voltage applied to the pinned layer and/or the first region 531 of the first magnetic resistor MR1.

When the processing apparatus 200 performs the read operation, the third switching element SW3 may be in an off status, and the pinned layer may not be electrically connected to the free layer via the third switching element SW3. When the third switching element SW3 is in an off status, the pinned layer may not be electrically connected to the first region 531 in the first magnetic resistor MR1. An electrical signal applied to the pinned layer may pass through the tunnel layer and the free layer.

A fourth switching element SW4 and a fifth switching element SW5 may be electrically connected to different data lines from each other. The fourth switching element SW4 may be electrically connected to the first data line DLa, and the fifth switching element SW5 may be electrically connected to a second data line DLb.

The first magnetic resistor MR1 and the second magnetic resistor MR2 may be connected to the first data line DLa via the fourth switching element SW4. The first switching element SW1 and the second switching element SW2 may be electrically connected to the second data line DLb via the fifth switching element SW5. The fourth switching element SW4 may be electrically connected to the pinned layers of the first magnetic resistor MR1 and the second magnetic resistor MR2, and the fifth switching element SW5 may be electrically connected to the first switching element SW1 and the second switching element SW2. The fourth switching element SW4 may mean a switching element electrically connected to the pinned layers of the first magnetic resistor MR1 and the second magnetic resistor MR2 of the bit-cell BC, and the fifth switching element SW5 may mean a switching element electrically connected to the first switching element SW1 and the second switching element SW2 of the bit-cell BC.

The fourth switching element SW4 and the fifth switching element SW5 may be driven based on a driving signal Sd provided by a row driver (for example, the row driver 230 in FIG. 2). However, a circuit of the bit-cell BC illustrated in FIG. 4 may be only an example, and the bit-cell BC may be implemented in a different manner from the circuit in FIG. 4 by using other circuit elements.

When the processing apparatus 200 performs the write operation, the first resistance value may be stored in the first magnetic resistor MR1. The resistance values of the first magnetic resistor MR1 and the second magnetic resistor MR2 may be determined by a weight setting signal applied to the bit-cell BC. For example, the first magnetic resistor MR1 may have the first resistance value corresponding to the weighting factor based on the lengths of the first region and the second region, and because a free layer includes a single domain of the first region 531, the second magnetic resistor MR2 may have the minimum resistance value (R min) of the magnetic resistor.

The weighting factor included in the weight setting signal applied to the bit-cell BC may vary. For example, when the weighting factor of 3 is applied to the bit-cell BC, the first resistance value of about 20Ω may be stored in the first magnetic resistor MR1, and the second resistance value of about 0Ω may be stored in the second magnetic resistor MR2. As another example, when the weighting factor of 2 is applied to the bit-cell BC, the first resistance value of about 15Ω may be stored in the first magnetic resistor MR1, and the second resistance value of about 0Ω may be stored in the second magnetic resistor MR2. In addition, when the weighting factor of 1 is applied to the bit-cell BC, the first resistance value of about 10Ω may be stored in the first magnetic resistor MR1, and the second resistance value of about 0Ω may be stored in the second magnetic resistor MR2. However, the first resistance value and the second resistance value respectively stored in the first magnetic resistor MR1 and the second magnetic resistor MR2 may not be limited the numbers described above.

A resistance value greater than that stored in the second magnetic resistor MR2 may be stored in the first magnetic resistor MR1. However, the embodiment is not necessarily limited thereto, and the same resistance value may be stored in the first magnetic resistor MR1 and the second magnetic resistor MR2.

The resistance value of the bit-cell BC may vary according to the weighting factor and the input signal applied to the bit-cell BC in FIG. 4. A relation between the input signal and the resistance value of the bit-cell BC may be summarized as Table 1 below.

TABLE 1

| first input signal | second input signal | first resistance value | second resistance value | signal input* resistance value |
| --- | --- | --- | --- | --- |
| 1 | 0 | R | Rmin | R |
| 0 | 1 | R | Rmin | Rmin |

Referring to Table 1, when the first input signal is about 1, and the second input signal is about 0, a value of multiplying the first input signal by the first resistance value may be R, or the first resistance value, and when the second input signal is about 0, and the second input signal is about 1, a value of multiplying the second input signal by the second resistance value may be R min, or the second resistance value.

When the resistance value of the bit-cell BC is measured or a voltage drop of the bit-cell BC due to a current of a constant value is measured, the resistance value may be a multiplication of the input signal applied to the bit-cell BC by the resistance value. In other words, a multiple of the input signal and the weighting factor may be obtained by using a multiple of the input signal applied to the bit-cell BC and the resistance value. By using this characteristic of the bit-cell BC, a processing apparatus (for example, a neuromorphic processor, or the like) for obtaining a multiplication and an accumulation of the input and the weight may be implemented.

Figure 6:
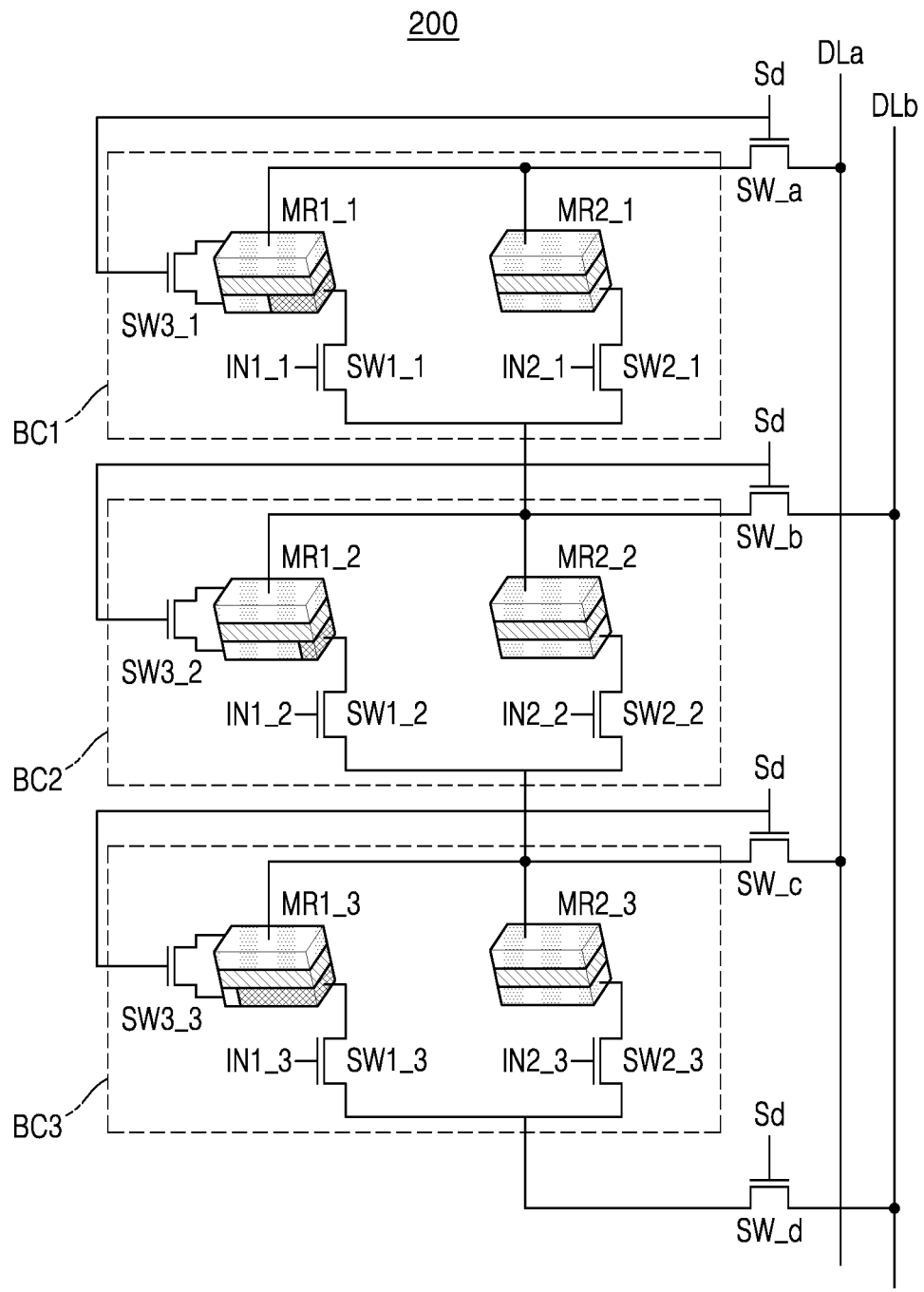
FIG. 6 is a diagram of bit-cells connected to each other in series, according to an example embodiment.

FIG. 6 is a diagram of bit-cells connected to each other in series, according to an example embodiment.

Referring to FIG. 6, the processing apparatus 200 may include first through third bit-cells BC1 through BC3. The first through third bit-cells BC1 through BC3 may be electrically connected to each other in series in one direction to constitute a bit-cell line. In FIG. 6, it is illustrated that three bit-cells are included, but the number of bit-cells is not limited thereto. Hereinafter, duplicate detailed descriptions of those already given above may be omitted.

Pinned layers of a first magnetic resistor MR1_1 and a second magnetic resistor MR2_1 of the first bit-cell BC1 may be electrically connected to a fourth switching element SW_a, and a first switching element SW1_1 and a second switching element SW2_1 of the first bit-cell BC1 may be electrically connected to a fifth switching element SW_b. Pinned layers of a first magnetic resistor MR1_2 and a second magnetic resistor MR2_2 of the second bit-cell BC2 may be electrically connected to a fourth switching element SW_b, and a first switching element SW1_2 and a second switching element SW2_2 of the second bit-cell BC2 may be electrically connected to a fifth switching element SW_c. Pinned layers of a first magnetic resistor MR1_3 and a second magnetic resistor MR2_3 of the third bit-cell BC3 may be electrically connected to a fourth switching element SW_c, and a first switching element SW1_3 and a second switching element SW2_3 of the third bit-cell BC3 may be electrically connected to a fifth switching element SW_d.

Bit-cells adjacent to each other of a plurality of bit-cells electrically connected by a bit-cell line may share at least one of a fourth switching element and a fifth switching element. In an example embodiment, the fourth switching element SW_b electrically connected to the first magnetic resistor MR1_2 and the second magnetic resistor MR2_2 of the second bit-cell BC2 may be electrically connected to the first switching element SW1_1 and the second switching element SW2_1 of the first bit-cell BC1 adjacent to the second bit-cell BC2. A switching element having a reference number/character of SW_b may be a fourth switching element electrically connected to the first magnetic resistor MR1_2 and the second magnetic resistor MR2_2 of the second bit-cell BC2, and may also be a fifth switching element electrically connected to the first switching element SW1_1 and the second switching element SW2_1 of the first bit-cell BC1. The first bit-cell BC1 and the second bit-cell BC2 may share the switching element having the reference number/character of SW_b as a fifth switching element and a fourth switching element, respectively.

In the first bit-cell BC1, the first bias voltage may be applied to the first magnetic resistor MR1_1 via the fourth switching element SW_a, and the second bias voltage may be applied to the first magnetic resistor MR1_1 via the fifth switching element SW_b. The first bias voltage may mean a bias voltage applied to the pinned layers of the first magnetic resistors MR1_1, MR1_2, and MR1_3, and the second bias voltage may mean a bias voltage applied to the second region 532 (FIGS. 5A-5C) of the first magnetic resistors MR1_1, MR1_2, and MR1_3. The first bias voltage, which is a voltage corresponding to the first data line DLa electrically connected to the fourth switching element SW_a, may be provided to the first magnetic resistor MR1_1 via the fourth switching element SW_a, and the second bias voltage, which is a voltage corresponding to the second data line DLb electrically connected to the fifth switching element SW_b, may be provided to the first magnetic resistor MR1_1 via the fifth switching element SW_b. The fourth switching element SW_a and the fifth switching element SW_b may be electrically connected to the first data line DLa and the second data line DLb, which are different from each other, respectively.

In the second bit-cell BC2, the first bias voltage may be applied to the first magnetic resistor MR1_2 via the fourth switching element SW_b, and the second bias voltage may be applied to the first magnetic resistor MR1_2 via the fifth switching element SW_c. The first bias voltage, which is a voltage corresponding to the second data line DLb electrically connected to the fourth switching element SW_b, may be provided to the first magnetic resistor MR1_2 via the fourth switching element SW_b, and the second bias voltage, which is a voltage corresponding to the first data line DLa electrically connected to the fifth switching element SW_c, may be provided to the first magnetic resistor MR1_2 via the fifth switching element SW_c. The fourth switching element SW_b and the fifth switching element SW_c may be electrically connected to the second data line DLb and the first data line DLa, which are different from each other, respectively.

Figure 7:
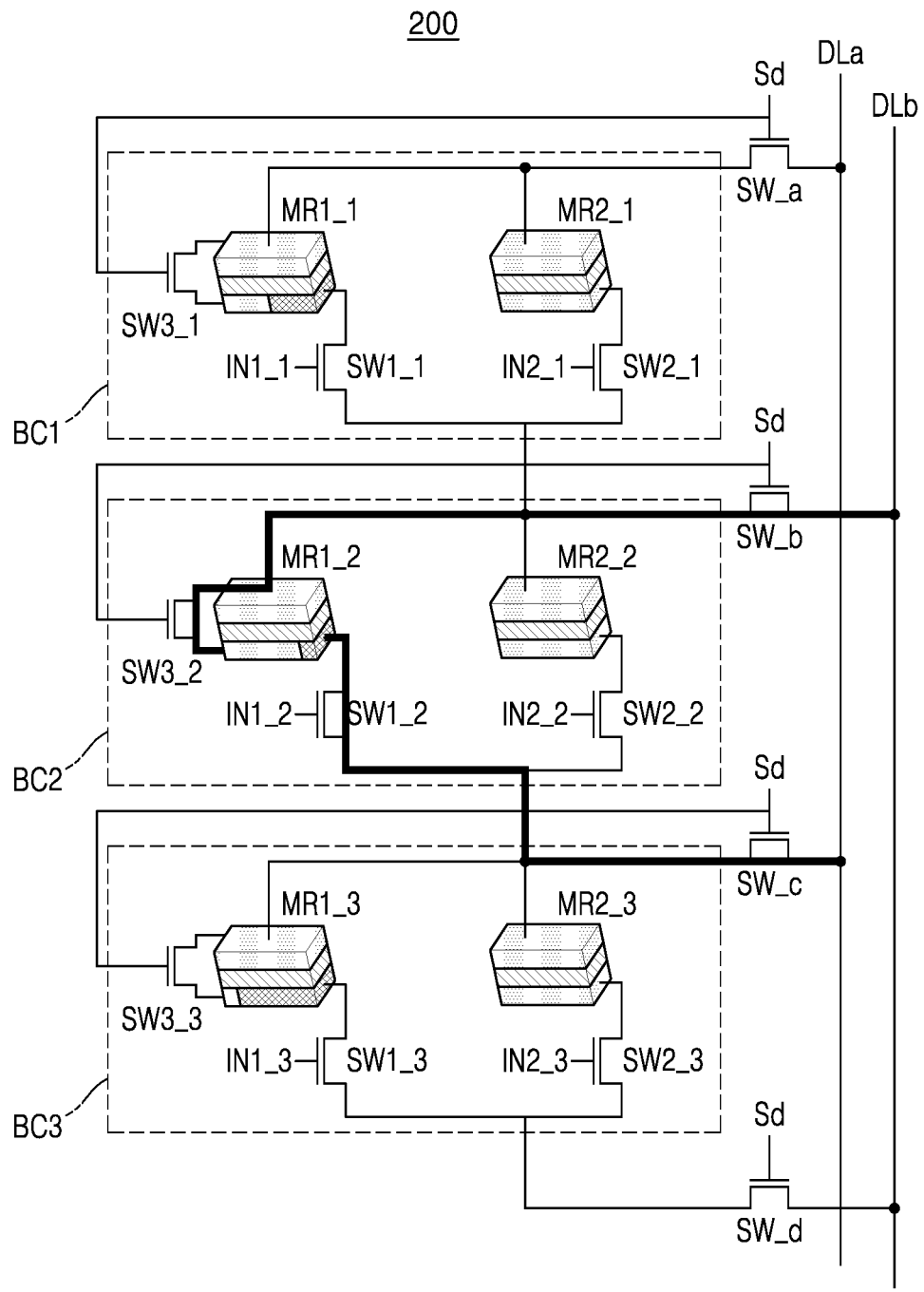
FIG. 7 is a diagram of a write operation of a processing apparatus, according to an example embodiment.

FIG. 7 is a diagram of the write operation of the processing apparatus 200, according to an example embodiment.

Referring to FIG. 7, when the processing apparatus 200 performs the write operation, a bit-cell, on which a write operation is to be performed, may be selected by using a fourth switching element and a fifth switching element. When the processing apparatus 200 performs the write operation, the fourth switching element and the fifth switching element electrically connected to a bit-cell, on which the write operation is to be performed, may be in an on status. An on/off status of the fourth switching element and the fifth switching element may be driven based on a control signal provided by a row driver (for example, the row driver 230 in FIG. 1). For example, when the write operation is performed on the first bit-cell BC1, the fourth switching element SW_a and the fifth switching element SW_b may be in an on status. When the write operation is performed on the second bit-cell BC2, the fourth switching element SW_b and the fifth switching element SW_c may be in an on status.

Each bit-cell may include a third switching element. The third switching element may be electrically connected to a pinned layer and a first region 531 (FIGS. 5A-5C) of a first magnetic resistor. The third switching element may be electrically connected to a fourth switching element electrically connected to a first magnetic resistor electrically connected to the third switching element. For example, a third switching element SW3_1 may be electrically connected to the pinned layer and the first region of the first magnetic resistor MR1_1, and may be electrically connected to the fourth switching element SW_a. As another example, a third switching element SW3_2 may be electrically connected to the pinned layer and the first region 531 of the first magnetic resistor MR1_2, and may be electrically connected to the fourth switching element SW_b.

When the processing apparatus 200 performs the write operation, the third switching element included in a bit-cell, on which the write operation is to be performed, may be in an on status. When the third switching element is in an on status, the pinned layer and the first region 531 of the first magnetic resistor may be electrically connected to each other via the third switching element. The first bias voltage applied to the pinned layer of the first magnetic resistor may be applied to the first region 531 via the third switching element.

When the processing apparatus 200 performs the write operation, the third switching element included in the bit-cell, on which the write operation is to be performed, and the fourth switching element and the fifth switching element electrically connected to the bit-cell, on which the write operation is to be performed, may be in an on status. For example, the third switching element SW3_2 of the second bit-cell BC2, on which the write operation is to be performed, the fourth switching element SW_b electrically connected to the second bit-cell BC2, and the fifth switching element SW_c electrically connected to the second bit-cell BC2 may be in an on status.

When the processing apparatus 200 performs the write operation, the first resistance value may be stored in the first magnetic resistor of the bit-cell, on which the write operation is to be performed. The first switching element electrically connected to the first magnetic resistor of the bit-cell, on which the write operation is to be performed, may be in an on status, and the second switching element may be in an off status.

When the processing apparatus 200 performs the write operation, the first resistance value may be stored, based on the first bias voltage applied to the first region 531 via the third switching element and the fourth switching element, and the second bias voltage applied to the second region 532 (FIGS. 5A-5C) via the first switching element and the fifth switching element. For example, the first resistance value may be stored in the first magnetic resistor MR1_2, based on the first bias voltage applied to the first region 531 of the first magnetic resistor MR1_2 via the third switching element SW3_2 and the fourth switching element SW_b of the second bit-cell BC2, on which the write operation is to be performed, and the second bias voltage applied to the second region 532 of the first magnetic resistor MR1_2 via the first switching element SW1_2 and the fifth switching element SW_c of the second bit-cell BC2 In other words, a voltage corresponding to the second data line DLb electrically connected to the fourth switching element SW_b may be provided as the first bias voltage to the pinned layer of the first magnetic resistor MR1_2 via the fourth switching element SW_b, and the first bias voltage may be provided to the first region 531 of the first magnetic resistor MR1_2 via the third switching element SW3_2. A voltage corresponding to the first data line DLa electrically connected to the fifth switching element SW_c may be provided as the second bias voltage to the second region 532 of the first magnetic resistor MR1_2 via the fifth switching element SW_b and the first switching element SW1_2. A magnetic domain-wall 533 (FIGS. 5A-5C) of the first magnetic resistor MR1_2 may be moved based on the first bias voltage and the second bias voltage provided to the first magnetic resistor MR1_2, and the first resistance value may be stored.

In an example embodiment, the write operation may be simultaneously performed on several bit-cells. For example, when the fourth switching element SW_b and the fifth switching element SW_b electrically connected to the first bit-cell BC1, and the fourth switching element SW_b and the fifth switching element SW_c electrically connected to the second bit-cell BC2 are simultaneously in an on status, the write operation may be simultaneously performed on the first bit-cell BC1 and the second bit-cell BC2.

Figure 8:
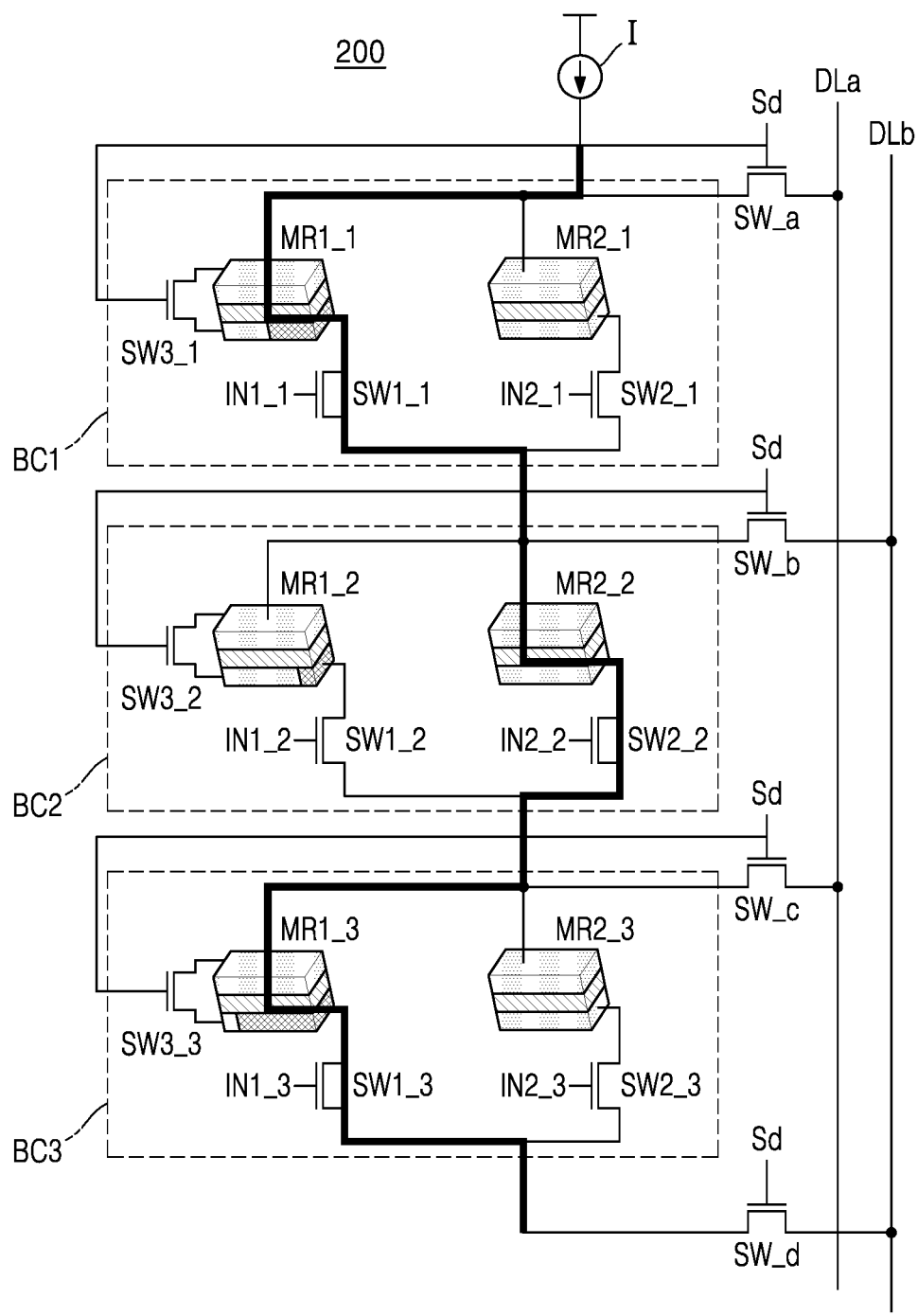
FIGS. 8 and 9 are diagrams of read operations of a processing apparatus, according to example embodiments.
Figure 9:
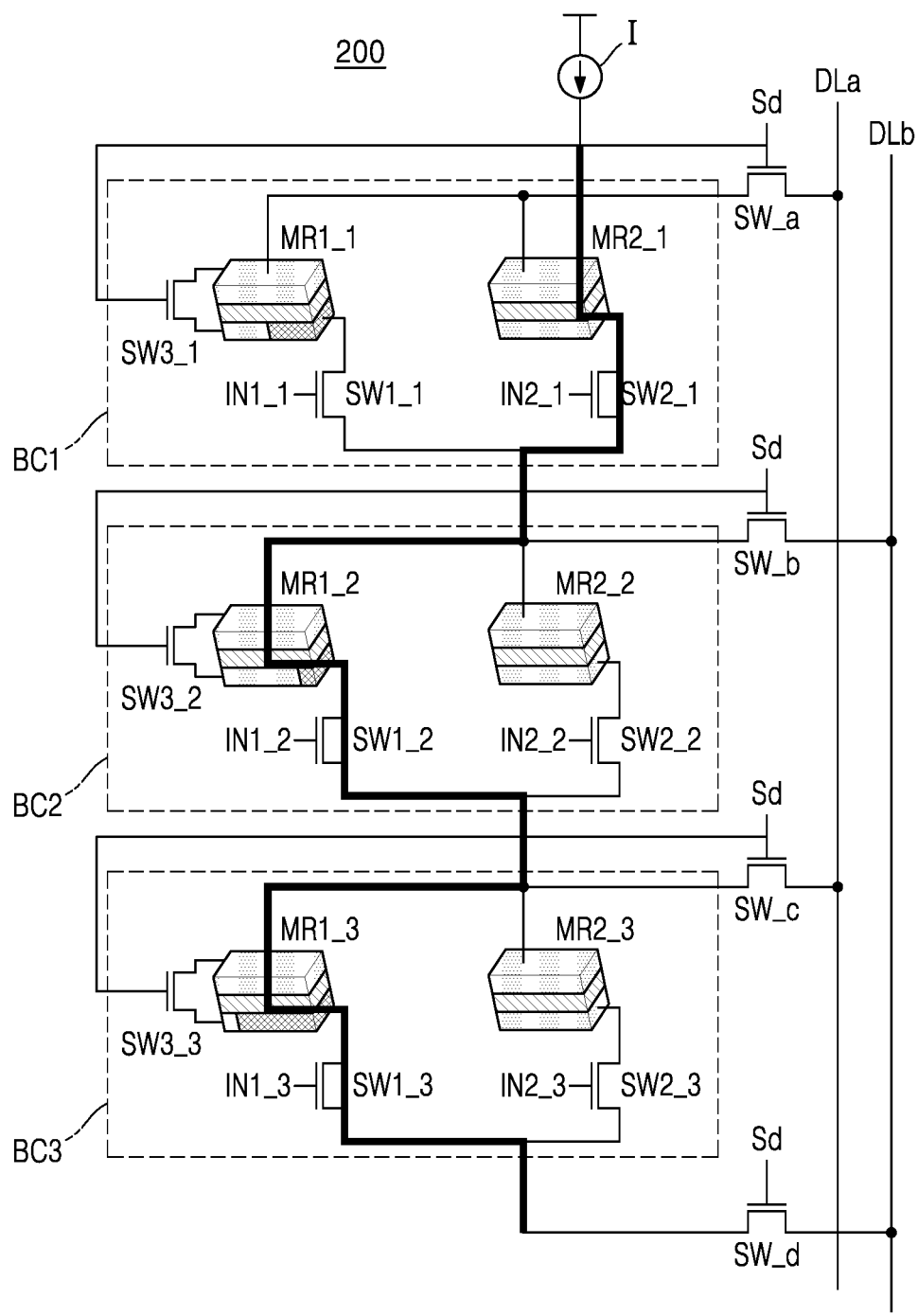

FIGS. 8 and 9 are diagrams of read operations of the processing apparatus 200, according to example embodiments.

Referring to FIGS. 8 and 9, the first bit-cell BC1, the second bit-cell BC2, and the third bit-cell BC3 may be electrically connected to each other in series to form a bit-cell line BCL (FIG. 3). When the processing apparatus 200 performs the read operation, a current I may be applied to a bit-cell line on which the read operation is to be performed. The current I may be provided by a current controller (for example, the current controller 260 in FIG. 2). Hereinafter, duplicate detailed descriptions of those already given above may be omitted.

When the processing apparatus 200 performs the read operation, the fourth switching element SW_a and the fifth switching element SW_b electrically connected to the first bit-cell BC1, on which the read operation is to be performed, may be in an off status. The fourth switching element SW_b and the fifth switching element SW_c electrically connected to the second bit-cell BC2, on which the read operation is to be performed, may be in an off status, and the fourth switching element SW_c and the fifth switching element SW_d electrically connected to the third bit-cell BC3, on which the read operation is to be performed, may be in an off status.

When the processing apparatus 200 performs the read operation on the first bit-cell BC1, the third switching element SW3_1 may be in an off status, and the pinned layer may not be electrically connected to the free layer in the first magnetic resistor MR1_1. When the processing apparatus 200 performs the read operation on the second bit-cell BC2, the third switching element SW3_2 may be in an off status, and the pinned layer may not be electrically connected to the free layer in the first magnetic resistor MR1_2. When the processing apparatus 200 performs the read operation on the third bit-cell BC3, a third switching element SW3_3 may be in an off status, and the pinned layer may not be electrically connected to the free layer in the first magnetic resistor MR1_3. Accordingly, the current I may flow through a pinned layer, a tunnel layer, and a free layer.

Referring to FIG. 8, when the processing apparatus 200 performs the read operation, a multiply operation may be performed on at least one of the input signals and at least one of the first resistance value and the second resistance value, based on an input signal (e.g., a respective input signal) input to each of the first switching elements SW1_1, SW1_2, and SW1_3 and the second switching elements SW2_1, SW2_2, and SW2_3 of at least one of the first through third bit-cells BC1 through BC3. When the current I of a constant value is applied to the bit-cell line BCL, a multiply operation value of the input signal and the resistance value applied to each of the first through third bit-cells BC1 through BC3 may be deducted from a voltage drop value occurring in each of the first through third bit-cells BC1 through BC3.

When the processing apparatus 200 performs the read operation, multiply operation values of the bit-cells of the first through third bit-cells BC1 through BC3 electrically connected to the bit-cell line BCL, in which a multiply operation has been performed, may be accumulated. When the current I of a constant value is applied to the bit-cell line BCL, a multiply operation value of the input signal applied to each of the first through third bit-cells BC1 through BC3 and the resistance value thereof may be deducted from an accumulated value of the voltage drops occurring in each of the first through third bit-cells BC1 through BC3.

Because the first input signals IN1_1, IN1_2, and IN1_3 and the second input signals IN2_1, IN2_2, and IN2_3 are complementary to each other, it is assumed that the first input signal IN1_1 is about 1, the second input signal IN2_1 is about 0, the first input signal IN1_2 is about 0, the second input signal IN2_2 is about 1, the first input signal IN1_3 is about 1, and the second input signal IN2_3 is about 0.

When the current I is applied to the bit-cell line BCL, because the first input signal IN1_1 is about 1, the current I may flow through the first magnetic resistor MR1_1 and the first switching element SW1_1, because the first input signal IN1_2 is about 0, the current I may flow through the second magnetic resistor MR2_2 and the second switching element SW2_2, and because the first input signal IN1_3 is about 1, the current I may flow through the first magnetic resistor MR1_3 and the first switching element SW1_3.

When the voltage in the bit-cell line BCL is measured, the measured voltage may correspond to an accumulated value of the voltage drops occurring in each of the first through third bit-cells BC1 through BC3. When the first resistance value of the first magnetic resistor MR1_1, the second resistance value of the second magnetic resistor MR2_2, and the first resistance value of the first magnetic resistor MR1_3 are defined as R1_1, R min, and R1_3, respectively, the measured voltage V may be determined as follows:

$$V=(R1\_1)*I+(R\ min)*I+(R1\_3)*I$$

Because the first resistance value R1_1 corresponds to a weighting factor, (R1_1)*I may correspond to a multiply operation value of the first input signal IN1_1 and the weighting factor. Because the first input signal IN1_2 is about 0, (R min)*I may correspond to a multiply operation value of the first input signal IN1_2 and the weighting factor. (R1_3)*I may correspond to a multiply operation value of the first input signal IN1_3 and the weighting factor.

Referring to FIG. 9, because the first input signals IN1_1, IN1_2, and IN1_3 and the second input signals IN2_1, IN2_2, and IN2_3 are complementary to each other, it is assumed that the first input signal IN1_1 is about 0, the second input signal IN2_1 is about 1, the first input signal IN1_2 is about 1, the second input signal IN2_2 is about 0, the first input signal IN1_3 is about 1, and the second input signal IN2_3 is about 0.

When the current I is applied to the bit-cell line BCL, because the first input signal IN1_1 is about 0, the current I may flow through the second magnetic resistor MR2_1 and the second switching element SW2_1, because the first input signal IN1_2 is about 1, the current I may flow through the first magnetic resistor MR1_2 and the first switching element SW1_2, and because the first input signal IN1_3 is about 1, the current I may flow through the first magnetic resistor MR1_3 and the first switching element SW1_3.

When the voltage in the bit-cell line BCL is measured, the measured voltage may correspond to the accumulated value of the voltage drop occurring in each of the first through third bit-cells BC1 through BC3. When the second resistance value of the second magnetic resistor MR2_1, the first resistance value of the first magnetic resistor MR1_2, and the first resistance value of the first magnetic resistor MR1_3 are defined as R min, R1_2, and R1_3, respectively, the measured voltage may be determined as follows:

$$V=(R\ min)*I+(R1\_2)*I+(R1\_3)*I$$

Because the first input signal IN1_1 is about 0, (R min)*I may correspond to a multiply operation value of the first input signal IN1_1 and the weighting factor. Because the first resistance value R1_2 corresponds to the weighting factor, (R1_2)*I may correspond to a multiply operation value of the first input signal IN1_2 and the weighting factor. (R1_3)*I may correspond to a multiply operation value of the first input signal IN1_3 and the weighting factor.

Figure 10:
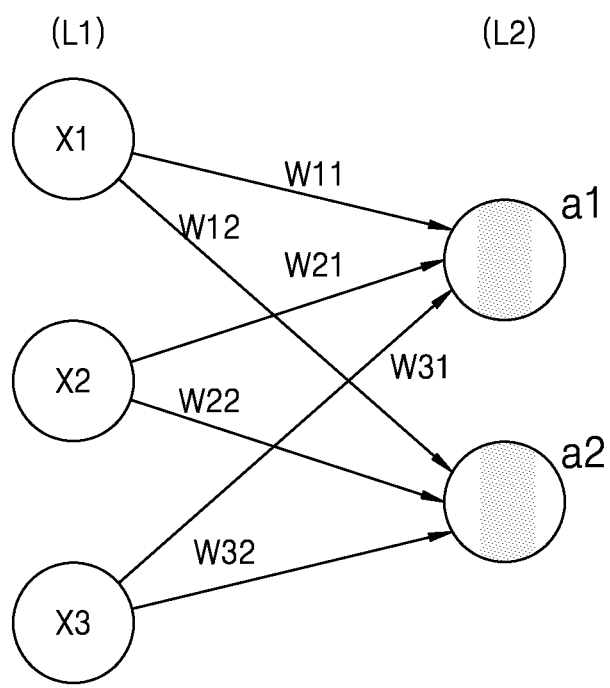
FIG. 10 is a conceptual diagram of an example of a neural network, according to an example embodiment.

FIG. 10 is a conceptual diagram of an example of a neural network, according to an example embodiment.

Referring to FIG. 10, as shown in Formula 2 below, at a first node a1 of a second layer L2, three multiply operations of respectively multiplying inputs x1, x2, and x3 provided by the nodes of a first layer L1 by weights w11, w21, and w31, and an accumulate/addition operation of multiplication result values may be performed. In addition, as shown in Formula 3 below, at a second node a2 of a second layer L2, three multiply operations of respectively multiplying inputs x1, x2, and x3 provided by the nodes of the first layer L1 by weights w12, w22, and w32, and an accumulate/addition operation of multiplication result values may be performed.

$$a1=x1\cdot w11+x2\cdot w21+x3\cdot w31 \qquad [\text{Formula 2}]$$

$$a2=x1\cdot w12+x2\cdot w22+x3\cdot w32 \qquad [\text{Formula 3}]$$

Hereinafter, an operation of the processing apparatus 200 performing a computation of the neural network of FIG. 10 is described with reference to FIG. 11.

Figure 11:
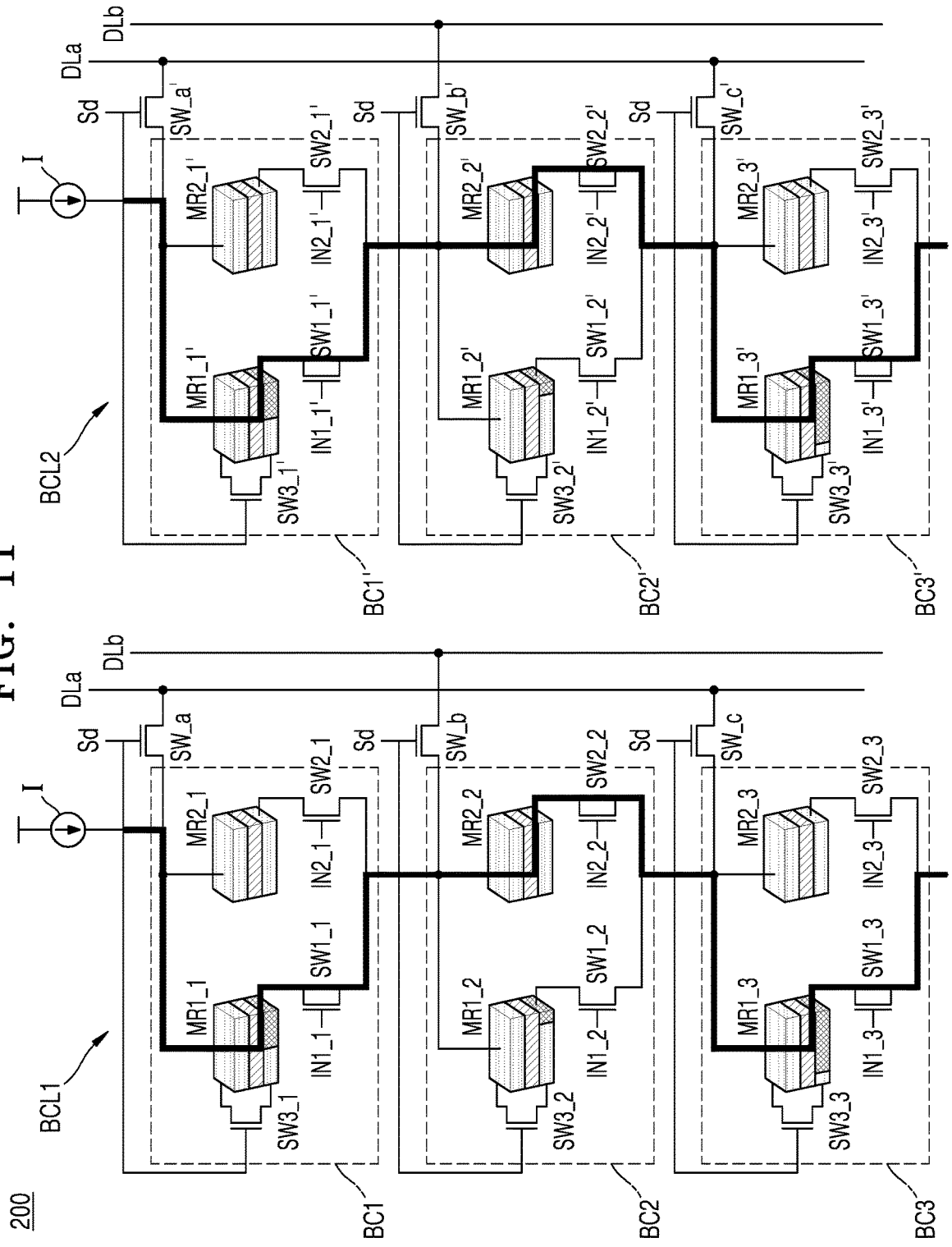
FIG. 11 is a circuit diagram of an operation of a computation performed by a processing apparatus, according to an example embodiment.

FIG. 11 is a circuit diagram of an operation of the processing apparatus 200 performing a computation, according to an example embodiment. The processing apparatus 200 of FIG. 11 may perform a computation required by the neural network of FIG. 10.

Referring to FIG. 11, the processing apparatus 200 may include two bit-cell lines BCL1 and BCL2 for performing a computation required by the second layer L2 in FIG. 10. The number of bit-cells BC and the number of bit-cell lines may vary according to the number of inputs and weights of the neural network.

Referring to FIGS. 10 and 11, the processing apparatus 200 may include a first bit-cell line BCL1 including three bit-cells BC1, BC2, and BC3, which are electrically connected to each other in series, and a second bit-cell line BCL2 including three bit-cells BC1', BC2', and BC3', which are electrically connected to each other in series. A computation of Formula 2 required at the first node a1 in FIG. 10 may be performed on the first bit-cell line BCL1, and a computation of Formula 3 required at the second node a2 may be performed on the second bit-cell line BCL2.

An input x1, an input x2, and an input x3 in FIG. 10 may correspond to first input signals IN1_1 and IN1_1', first input signals IN1_2 and IN1_2', and first input signals IN1_3 and IN1_3' in FIG. 11, respectively. Weighting factors w11, w21, and w31 in FIG. 10 may correspond to first resistance values R1_1, R1_2, and R1_3 stored in first magnetic resistors MR1_1, MR1_2, and MR1_3, respectively. Weighting factors w12, w22, and w32 in FIG. 10 may correspond to first resistance values R1_1', R1_2', and R1_3' stored in first magnetic resistors MR1_1', MR1_2', and MR1_3', respectively.

When the current I of a constant value is applied to the first bit-cell line BCL1, an accumulated value of multiply operation values of the first input signals IN1_1, IN1_2, and IN1_3 and the first resistance values R1_1, R1_2, and R1_3, respectively, which are applied to each of the first through third bit-cells BC1 through BC3, may be deducted from an accumulated value of the voltage drops occurring in each of the first through third bit-cells BC1 through BC3.

When it is assumed that the first input signal IN1_1 is about 1, the first input signal IN1_2 is about 0, and the first input signal IN1_3 is about 1, a voltage measured on the first bit-cell line BCL1 may be as follows:

$$V1=(R1\_1)*I+(R\ min)*I+(R1\_3)*I$$

When the current I of a constant value is applied to the second bit-cell line BCL2, an accumulated value of multiply operation values of the first input signals IN1_1', IN1_2', and IN1_3' and the first resistance values R1_1', R1_2', and R1_3', respectively, which are applied to each of the first through third bit-cells BC1 through BC3, may be deducted from an accumulated value of the voltage drops occurring in each of the first through third bit-cells BC1' through BC3'.

When it is assumed that the first input signal IN1_1' is about 1, the first input signal IN1_2' is about 0, and the first input signal IN1_3' is about 1, a voltage measured on the second bit-cell line BCL2 may be as follows:

$$V2=(R1\_1')*I+(R\ min)*I+(R1\_3')*I$$

In FIG. 11, although it described as an example that each of the first and second bit-cell lines BCL1 and BCL2 includes three bit-cells, a bit-cell line may include one or more bit-cells. For example, the number of bit-cells in one bit-cell line may be between 64 and 256. In addition, in FIG. 11, although the processing apparatus 200 includes only two bit-cell lines BCL1 and BCL2 as an example, the processing apparatus 200 may include one or more bit-cell lines. For example, the number of bit-cell lines in the processing apparatus 200 may be between 64 and 128. On the other hand, the bit-cell lines including a plurality of bit-cells may be arranged in a plurality to constitute the bit-cell array.

The processing apparatus 200 may include an in-memory processing apparatus which stores a value corresponding to a weighting factor in a memory including the first magnetic resistor, and performs a computation by using values stored in the memory. The in-memory processing apparatus may improve the speed of data transfer and power consumption, unlike the von Neumann structure in which the memory is separated from a computation unit.

Figure 12:
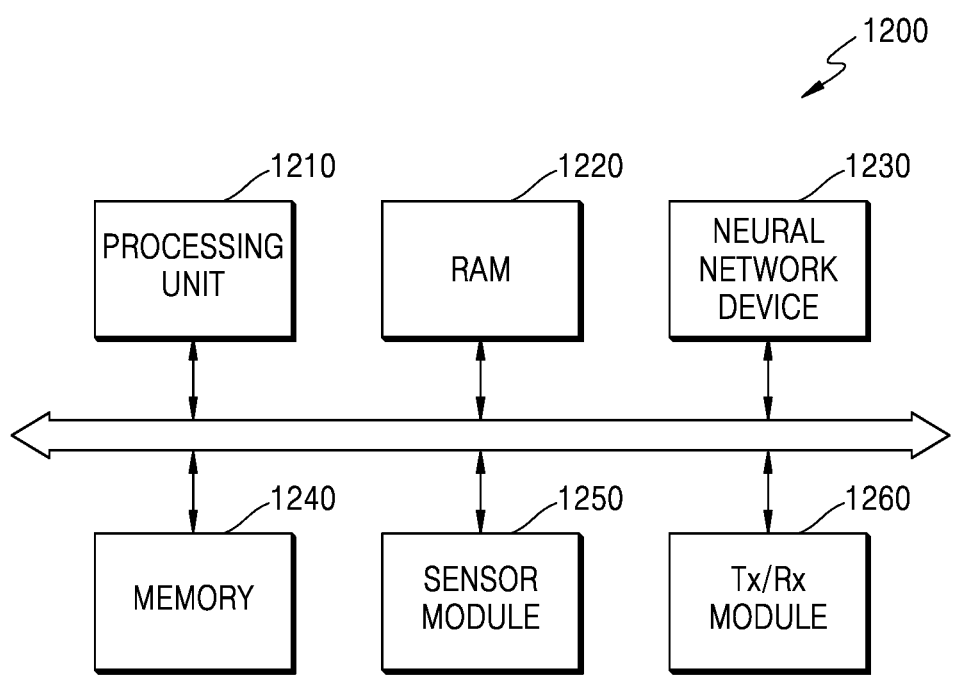
FIG. 12 is a block diagram of an electronic system including a processing apparatus, according to an example embodiment.

FIG. 12 is a block structure diagram of an electronic system 1200 including a processing apparatus, according to an embodiment.

Referring to FIG. 12, the electronic system 1200 may extract valid information by analyzing input data based on a neural network device 1230 including a processing apparatus, determine the status based on the extracted information, or control components of an electronic device on which the electronic system 1200 is mounted. For example, the electronic system 1200 may be applied to a robot device such as a drone and an advanced driver assistance system (ADAS), a smart TV, a smart phone, a medical device, a mobile device, an image display device, a measurement device, an Internet of Things (IoT) device, or the like, and in addition, may be mounted on various kinds of electronic devices.

The electronic system 1200 may include, in addition to the neural network device 1230, a processing unit 1210, a random access memory (RAM) 1220, a memory 1240, a sensor module 1250, and a communication module (Tx/Rx module) 1260. In addition, the electronic system 1200 may further include an input/output module, a security module, a power controller, etc. Some of the hardware components of the electronic system 1200 may be mounted as a semiconductor chip. The neural network device 1230 may include a processing apparatus of above-described embodiments implemented in an on-chip type, or may include a device including the processing apparatus of above-described embodiments as a portion of the neural network device 1230.

The processing unit 1210 may control all operations of the electronic system 1200. The processing unit 1210 may include a central processing unit (CPU), and may include one single core or a multi-core. The processing unit 1210 may process or execute programs and/or data stored in the memory 1240, and by executing the programs stored in the memory 1240, may control functions of the neural network device 1230. The processing unit 1210 may also be implemented in a graphics processing unit (GPU), an application processor (AP), or the like, in addition to the CPU.

The RAM 1220 may temporarily store programs, data, or instructions. For example, the programs and/or data stored in the memory 1240 may be temporarily stored in the RAM 1220 according to a control or booting code of the processing unit 1210. The RAM 1220 may be implemented in a memory device such as dynamic RAM (DRAM) and static RAM (SRAM).

The neural network device 1230 may perform a computation of the neural network based on the received input data, and may generate an information signal based on the result of the computation. The neural network device 1230 may include the processing apparatus of the above-described embodiments. The neural network may include a convolution neural network (CNN), a recurrent neural network (RNN), a deep belief network, a restricted Boltzmann machine, or the like, in addition to a deep neural network (DNN), but is not limited thereto. The neural network device 1230 may correspond to a hardware accelerator dedicated for the neural network.

The information signal may include various kinds of recognition signals such as a speech recognition signal, an object recognition signal, an image recognition signal, and a biometric information recognition signal. For example, the neural network device 1230 may receive frame data included in a video stream as input data, and may generate a recognition signal for an object included in an image represented by the frame data. The neural network device 1230 may receive various types of input data according to a type or function of an electronic device on which the electronic system 1200 is mounted, and may generate the recognition signal according to the input data.

The memory 1240 may be a storage area for storing data, and may store an operating system (OS), various programs, and various data. The memory 1240 may include a volatile memory or a non-volatile memory.

The sensor module 1250 may collect information about a periphery of the electronic device on which the electronic system 1200 is mounted. The sensor module 1250 may include various types of sensing devices, and may sense or receive signals (for example, an image signal, an audio signal, a magnetic signal, a biometric signal, a touch signal, or the like) from the outside of an electronic device, and may convert the sensed or received signals into data. In addition, the sensor module 1250 may provide the converted data to the neural network device 1230 as input data.

The communication module 1260 may have various wired or wireless interfaces capable of communicating with an external device.

The electronic system 1200 may further include a permanent storage such as a processor, a memory device storing and executing program data, and a disk drive, and a communication port communicating with an external device, as well as a user interface device such as a touch panel and a button, etc. Methods implemented as a software module or an algorithm may be stored on a computer-readable recording medium as computer-readable code or program commands executable by a processor.

While the inventive concept has been particularly shown and described with reference to embodiments thereof, it will be understood that various changes in form and details may be made therein without departing from the scope of the following claims.

What is claimed is:

1. A processing apparatus comprising:
   a bit-cell array comprising at least one bit-cell line including a plurality of bit-cells electrically connected to each other in series, wherein each of the plurality of bit-cells comprises:
a first magnetic resistor that is configured to store a first resistance value based on a movement of a location of a magnetic domain-wall;
a second magnetic resistor that is configured to store a second resistance value, wherein the second resistance value is equal to or less than the first resistance value;
a first switching element configured to switch an electrical signal applied to the first magnetic resistor; and
a second switching element configured to switch an electrical signal applied to the second magnetic resistor.

2. The processing apparatus of claim 1, wherein the first magnetic resistor comprises:
a pinned layer having a magnetization direction thereof pinned;
a free layer comprising the magnetic domain-wall; and
a tunnel layer between the pinned layer and the free layer.

3. The processing apparatus of claim 2,
wherein the free layer comprises a first region having an identical magnetization direction to the pinned layer and a second region having a different magnetization direction from the pinned layer, and
wherein the first magnetic resistor is configured to store the first resistance value based on lengths of the first region and the second region.

4. The processing apparatus of claim 3, wherein the first magnetic resistor is configured to store the first resistance value based on a first bias voltage provided to the first region and a second bias voltage provided to the second region.

5. The processing apparatus of claim 3, wherein the first resistance value is directly proportional to the length of the second region.

6. The processing apparatus of claim 2, wherein each of the plurality of bit-cells further comprises:
a third switching element electrically connected to the pinned layer and the free layer.

7. The processing apparatus of claim 6, wherein, when the processing apparatus performs a write operation,
the third switching element is in an on status, and the pinned layer is electrically connected to the free layer via the third switching element.

8. The processing apparatus of claim 6, wherein, when the processing apparatus performs a read operation,
the third switching element is in an off status, and the pinned layer is not electrically connected to the free layer via the third switching element.

9. The processing apparatus of claim 1, wherein, when a read operation is performed by the processing apparatus, the processing apparatus performs a multiply operation on:
at least one of a plurality of input signals of at least one of the plurality of bit-cells; and
at least one of the first resistance value and the second resistance value.

10. The processing apparatus of claim 9, wherein, when the read operation is performed, the processing apparatus adds:
multiply operation result values of the bit-cells on which the multiply operation has been performed.

11. The processing apparatus of claim 1, wherein a first input signal input to the first switching element and a second input signal input to the second switching element are complementary to each other.

12. The processing apparatus of claim 2,
wherein the bit-cell array further comprises:
a fourth switching element electrically connected to the pinned layer of the first magnetic resistor; and
a fifth switching element electrically connected to the first switching element and the second switching element.

13. The processing apparatus of claim 12,
wherein, when the processing apparatus performs a write operation, the fourth switching element and the fifth switching element electrically connected to the bit-cell on which the write operation is performed are in an on status, and
wherein, when the processing apparatus performs a read operation, the fourth switching element and the fifth switching element electrically connected to the bit-cell on which the read operation is performed are in an off status.

14. The processing apparatus of claim 12, wherein adjacent ones of the plurality of bit-cells share at least one of the fourth switching element and the fifth switching element.

15. A processing apparatus comprising:
a bit-cell array comprising at least one bit-cell line including a plurality of bit-cells electrically connected to each other in series,
wherein each of the plurality of bit-cells comprises:
a first magnetic resistor that is configured to store a first resistance value based on a movement of a location of a magnetic domain-wall;
a second magnetic resistor electrically connected to the first magnetic resistor in parallel, and configured to store a second resistance value that is equal to or less than the first resistance value;
a first switching element electrically connected to the first magnetic resistor in series, and configured to switch an electrical signal applied to the first magnetic resistor;
a second switching element electrically connected to the second magnetic resistor in series, and configured to switch an electrical signal applied to the second magnetic resistor; and
a third switching element connecting layers of the first magnetic resistor to each other, the layers having an identical magnetization direction to each other.

16. The processing apparatus of claim 15, wherein the first magnetic resistor comprises:
a pinned layer, of the layers that are electrically connected to each other, the pinned layer having the identical magnetization direction pinned;
a free layer, of the layers that are electrically connected to each other, the free layer comprising the magnetic domain-wall; and
a tunnel layer between the pinned layer and the free layer.

17. The processing apparatus of claim 16,
wherein the free layer comprises a first region having the identical magnetization direction and a second region having a different magnetization direction from the first region, and
wherein the third switching element is electrically connected to the pinned layer and the first region.

18. A processing apparatus comprising:
a bit-cell array comprising at least one bit-cell line including a plurality of bit-cells electrically connected to each other in series,
wherein each of the plurality of bit-cells comprises:
a first magnetic resistor comprising a pinned layer having a magnetization direction thereof pinned, a free layer comprising a magnetic domain-wall and a first region having an identical magnetization direction to the pinned layer and a second region having a different magnetization direction from the pinned layer, and a tunnel layer between the pinned layer and the free layer, wherein the first magnetic resistor is configured to store a first resistance value based on a movement of a location of the magnetic domain-wall;

a second magnetic resistor that is configured to store a second resistance value that is equal to or less than the first resistance value;

a first switching element configured to switch an electrical signal applied to the first magnetic resistor; and a second switching element configured to switch an electrical signal applied to the second magnetic resistor, wherein the bit-cell array comprises:

a fourth switching element electrically connected to the first magnetic resistor and the second magnetic resistor; and a fifth switching element electrically connected to the first switching element and the second switching element, and electrically connected to a different data line from a data line to which the fourth switching element is electrically connected.

19. The processing apparatus of claim 18, wherein the fourth switching element is electrically connected to the first switching element and the second switching element of a first bit-cell adjacent to a second bit-cell comprising the first magnetic resistor and the second magnetic resistor electrically connected to the fourth switching element.

20. The processing apparatus of claim 18, wherein each of the plurality of bit-cells further comprises a third switching element electrically connected to the pinned layer and the first region of the first magnetic resistor, wherein, when the processing apparatus performs a write operation, the third switching element, the fourth switching element, and the fifth switching element of a bit-cell on which the write operation is performed are in an on status, wherein a voltage corresponding to a first data line electrically connected to the fourth switching element is provided to the pinned layer as a first bias voltage via the fourth switching element, wherein the first bias voltage is provided to the first region via the third switching element, and wherein a voltage corresponding to a second data line electrically connected to the fifth switching element is provided to the second region as a second bias voltage via the fifth switching element and the first switching element.

* * * * *